(12) United States Patent
Hashimoto

(10) Patent No.: US 6,744,122 B1
(45) Date of Patent: Jun. 1, 2004

(54) SEMICONDUCTOR DEVICE, METHOD OF MANUFACTURE THEREOF, CIRCUIT BOARD, AND ELECTRONIC DEVICE

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/856,924

(22) PCT Filed: Sep. 29, 2000

(86) PCT No.: PCT/JP00/06767

§ 371 (c)(1),
(2), (4) Date: May 30, 2001

(87) PCT Pub. No.: WO01/26147

PCT Pub. Date: Apr. 12, 2001

(30) Foreign Application Priority Data

Oct. 4, 1999 (JP) ............................................. 11-282474

(51) Int. Cl.[7] ........................ H01L 23/495; H01L 23/48
(52) U.S. Cl. ................. 257/668; 257/676; 257/688; 257/694; 257/737; 257/738; 257/739; 257/774
(58) Field of Search ................ 257/668, 676, 257/688, 694, 698, 737, 738, 739, 774, 778, 782, 783, 784, 786, 779

(56) References Cited

U.S. PATENT DOCUMENTS 5,949,142 A  * 9/1999 Otsuka ....................... 257/703
6,022,761 A  * 2/2000 Grupen-Shemansky et al. ............................ 438/125
2002/0003308 A1  * 1/2002 Kim et al. ................... 257/778

FOREIGN PATENT DOCUMENTS

| JP | U 50-136357 | 4/1974 |
| JP | U 5-48359 | 6/1993 |
| JP | A 6-333982 | 12/1994 |
| JP | A 7-122589 | 5/1995 |
| JP | A 7-142490 | 6/1995 |
| JP | A 7-176534 | 7/1995 |
| JP | A 7-201911 | 8/1995 |
| JP | A 8-335604 | 12/1996 |
| JP | A 9-167771 | 6/1997 |
| JP | A 10-173003 | 6/1998 |
| JP | A 10-223695 | 8/1998 |
| JP | A 10-321633 | 12/1998 |
| JP | A 11-238845 | 8/1999 |
| JP | A 11-251472 | 9/1999 |

* cited by examiner

Primary Examiner—Minhloan Tran
Assistant Examiner—Tan Tran
(74) Attorney, Agent, or Firm—Oliff & Berridge, PLC

(57) ABSTRACT

A semiconductor device comprising: a substrate (30) including a plurality of holes (36) and a surface over which an interconnecting pattern (32) is formed, part of the interconnecting pattern (32) being superposed over the holes (36); a semiconductor chip (10) including a plurality of electrodes (12) which are disposed over another surface of the substrate (30) to correspond to the holes (36); and conductive members provided within the holes (36) for electrically connecting the electrodes (12) to the interconnecting pattern (32)

6 Claims, 10 Drawing Sheets

SEMICONDUCTOR DEVICE, METHOD OF MANUFACTURE THEREOF, CIRCUIT BOARD, AND ELECTRONIC DEVICE

TECHNICAL FIELD

The present invention relates to a semiconductor device and a method of fabricating the semiconductor device, a circuit board, and an electronic instrument.

BACKGROUND ART

As one type of CSP (Chip Scale/Size Package) semiconductor devices, a semiconductor device with a structure in which a semiconductor chip is mounted face-down to a substrate has been known. In such a face down structure, a semiconductor chip is generally mounted on a surface of the substrate on which an interconnecting pattern is formed. Therefore, since part of the interconnecting pattern is covered with the semiconductor chip, the degree of freedom in designing the interconnecting pattern is limited.

DISCLOSURE OF THE INVENTION

The present invention has been achieved to solve this problem. An objective of the present invention is to provide a semiconductor device and a method of fabricating the same capable of increasing the degree of freedom in designing an interconnecting pattern without decreasing connection reliability, a circuit board, and an electronic instrument.

(1) According to the present invention, there is provided a semiconductor device comprising:

a substrate including a plurality of holes and a surface over which an interconnecting pattern is formed, part of the interconnecting pattern extending over the holes;

a semiconductor chip disposed over another surface of the substrate and including a plurality of electrodes to be positioned over the holes; and conductive members provided within the holes for electrically connecting the electrodes to the interconnecting pattern.

According to the present invention, the conductive members formed on the electrodes of the semiconductor chip are disposed within the holes and connected to the interconnecting pattern. Therefore, the interconnecting pattern is located on the side of the substrate opposite to the mounting region of the semiconductor chip. Specifically, since the interconnecting pattern is not covered with the semiconductor chip, the interconnecting pattern can be designed without limitation. Moreover, there is a substrate between the interconnecting pattern and the semiconductor chip. Therefore, signals in an integrated circuit in the semiconductor chip scarcely interfere with signals in the interconnecting pattern, whereby cross talk can be reduced. Because of this, a semiconductor device with an increased degree of freedom in designing the interconnecting pattern can be obtained without decreasing connection reliability.

(2) In this semiconductor device, a resin may be provided between the substrate and the semiconductor chip.

According to this semiconductor device, the semiconductor chip is mounted on a surface of the substrate on which the interconnecting pattern is not required, and a resin is provided between the substrate and the semiconductor chip. Therefore, if an interconnecting pattern is not formed over the surface of the substrate over which the semiconductor chip is mounted, the resin is provided on the substrate exhibiting comparatively excellent adhesion, so that delamination can be reduced. Because of this, a semiconductor device with an increased degree of freedom in designing the interconnecting pattern can be obtained more effectively without decreasing connection reliability.

(3) In this semiconductor device, the resin may be an anisotropic conductive material containing conductive particles; and the conductive members may be electrically connected to the interconnecting pattern through the conductive particles.

(4) In this semiconductor device, part of the interconnecting pattern may close the holes.

(5) In this semiconductor device, the interconnecting pattern may include a plurality of interconnecting lines; and two or more interconnecting lines may extend over each of the holes.

This enables holes necessary for the substrate can be easily formed.

(6) In this semiconductor device, the other surface of the substrate may be roughed.

Since a contact area between the resin and the substrate is increased, adhesion between them can be further improved.

(7) In this semiconductor device, a recognition hole may be formed in the substrate at a position differing from the holes; and a recognition pattern may be formed over the recognition hole on the side of a surface of the substrate including the interconnecting pattern.

This enables to mount the semiconductor chip easily over the substrate.

(8) In this semiconductor device, the recognition hole may be formed in the substrate outside a mounting region for the semiconductor chip.

This makes it possible to mount the semiconductor chip easily over the substrate.

(9) In this semiconductor device, the recognition pattern may includes:

a first pattern extending in the X-axis direction of the two-dimensional coordinate system established on a surface of the substrate; and a second pattern extending in the Y-axis direction.

This enables the semiconductor chip to be accurately mounted at a given position on the substrate by recognizing the first and second patterns.

(10) In this semiconductor device, the conductive members may be a plurality of layered bumps.

This enables the conductive members to be formed by using existing techniques and devices, for example.

(11) In this semiconductor device, the bumps may include first bumps formed on the electrodes and second bumps formed on the first bumps.

Note that the first and second bumps refer to two arbitrary bumps, and this is applicable to two or more bumps.

(12) In this semiconductor device, at least the first bumps may be ball bumps.

According to this semiconductor device, the first bumps may be formed by the ball bump method. Since existing wire bonder devices can be utilized, the semiconductor device can be fabricated with reduced equipment investment.

(13) In this semiconductor device, the second bumps may be formed of a metal which has a melting point lower than the melting point of the first bumps.

According to this semiconductor device, since the first bumps formed in advance have a higher melting point, the first bumps are less affected by heat for forming the second bumps, for example. Therefore, a plurality of bumps can be easily layered.

(14) In this semiconductor device, the first bumps may be formed of gold.

Gold has a comparatively high melting point.

(15) In this semiconductor device, the second bumps may be formed of solder.

(16) In this semiconductor device, the first bumps and the second bumps may be formed of the same material.

This enables the second bump to also be formed by the ball bump method, for example.

(17) In this semiconductor device, the semiconductor chip may be mounted face-down to the substrate.

According to this semiconductor device, the interval between the semiconductor chip and the substrate is increased by the height of the first and second bumps formed on the electrodes of the semiconductor chip, so a large amount of resin can be provided right under the semiconductor chip, thereby enabling the resin to fully function as a stress relaxation layer. If the first bump is formed of gold and the second bump is formed of solder, a mounting structure of solder bumps with a core (gold) can be easily obtained.

(18) According to the present invention, there is provided a circuit board over which the above-described semiconductor device is mounted.

(19) An electronic instrument according to the present invention is provided with the above semiconductor device.

(20) According to the present invention, there is provided a method of fabricating a semiconductor device comprising the steps of:

preparing a substrate including a plurality of holes and an interconnecting pattern which extends partially over the holes, and also preparing a semiconductor chip having a plurality of electrodes which have conductive members formed on the electrodes; and disposing the conductive members within the holes and mounting the semiconductor chip over the substrate to connect electrically the interconnecting pattern to the electrodes through the conductive members.

According to the present invention, the conductive members formed on the electrodes of the semiconductor chip are disposed within the holes and connected to the interconnecting pattern. Therefore, the interconnecting pattern is located on the side of the substrate opposite to the mounting region of the semiconductor chip. Specifically, since the interconnecting pattern is not covered with the semiconductor chip, the interconnecting pattern can be designed without limitation. Moreover, there is a substrate between the interconnecting pattern and the semiconductor chip. Therefore, signals in an integrated circuit in the semiconductor chip scarcely interfere with signals in the interconnecting pattern, whereby cross talk can be reduced. Because of this, a semiconductor device with an increased degree of freedom in designing the interconnecting pattern can be obtained without decreasing connection reliability.

(21) This method of fabricating a semiconductor device may further comprise a step of providing a resin over the substrate in a region for mounting the semiconductor chip.

According to this semiconductor device, the semiconductor chip is mounted on a surface of the substrate on which the interconnecting pattern is not required, and a resin is provided between the substrate and the semiconductor chip. Therefore, if an interconnecting pattern is not formed over the surface of the substrate over which the semiconductor chip is mounted, the resin is provided on the substrate exhibiting comparatively excellent adhesion, so that interface delamination can be reduced by the heat in the mounting process. Because of this, a semiconductor device with an increased degree of freedom in designing the interconnecting pattern can be obtained more effectively without decreasing connection reliability.

(22) In this method of fabricating a semiconductor device, the resin may be an anisotropic conductive material containing conductive particles; and after the provision of the resin, the conductive members may be electrically connected to the interconnecting pattern through the conductive particles.

This enables the electrodes of the semiconductor chip to be electrically connected to the interconnecting pattern through the anisotropic conductive material, and, at the same time, the semiconductor chip and the substrate can be underfilled. Therefore, a semiconductor device can be fabricated using a method excelling in productivity.

(23) In this method of fabricating a semiconductor device, the holes may be formed in the substrate to be positioned under the electrodes;

part of the interconnecting pattern may close the holes; and the conductive members may be disposed within the holes.

(24) In this method of fabricating a semiconductor device, the interconnecting pattern may include a plurality of interconnecting lines;

two or more of the interconnecting lines may extend over each of the holes in the substrate; and two or more of the conductive members may be disposed within each of the holes.

This enables to easily form holes necessary for the substrate.

(25) In this method of fabricating a semiconductor device, the step of providing a resin may include a step of mounting the substrate over a member;

the member may have properties which repel the resin at least in a region facing the holes in the substrate; and the resin may be provided after the mounting of the substrate over the member with a surface of the substrate having the interconnecting pattern to face the member.

This enables the resin to be provided on the substrate without leaking out from slits.

(26) This method of fabricating a semiconductor device may further comprise a step of roughing the other surface of the substrate.

According to this method, since a contact area between the substrate and the resin increases, adhesion between the resin and the substrate can be further improved.

(27) This method of fabricating a semiconductor device may further comprise a step of forming a recognition hole in the substrate at a position differing from the holes, and forming a recognition pattern over the recognition hole on the side of a surface of the substrate including the interconnecting pattern.

This enables the semiconductor chip to be easily mounted over the substrate.

(28) In this method of fabricating a semiconductor device, the recognition pattern may include a first pattern extending in the X-axis direction of the two-dimensional coordinate system established on a surface of the substrate, and a second pattern extending in the Y-axis direction; and positioning of the semiconductor chip and the substrate may be carried out by using the recognition pattern.

This enables the semiconductor chip to be accurately mounted at a given position over the substrate by recognizing the first and second patterns.

(29) In this method of fabricating a semiconductor device, the conductive members may be a plurality of layered bumps.

This enables the conductive members to be reliably formed.

(30) In this method of fabricating a semiconductor device, the bumps may be formed by:

a first step of bonding a first conductive wire to one of the electrodes of the semiconductor chip and cutting the bonded first conductive wire with part of the first conductive wire to remain on the one of the electrodes;

a second step of forming a first bump by pressing the remaining part of the first conductive wire on the electrode;

a third step of bonding a second conductive wire to the at first bump and cutting the bonded second conductive wire with part of the second conductive wire to remain on the first bump; and a fourth step of forming a second bump by pressing the remaining part of the second conductive wire on the first bump.

According to this method, the first and second bumps can be layered merely by bonding the first or second conductive wire on the electrode or first bump, cutting the conductive wire while allowing part of the conductive wire to remain on the electrode or first bump, and pressing the remaining conductive wire. These steps can be performed in a short period of time in comparison with the case of layering the bumps by plating.

Note that the first and second bumps refer to two arbitrary bumps, and this is applicable to two or more bumps.

(31) In this method of fabricating a semiconductor device, the first step may be repeated for the plurality of electrodes to provide each of the electrodes with part of the first conductive wire; and the remaining parts of the first conductive wires on the electrodes may be simultaneously pressed to form the first bumps at a time in the second step.

According to this method, since a plurality of first bumps can be formed at the same time, the number of steps can be further reduced.

(32) In this method of fabricating a semiconductor device, the third step may be repeated to provide each of the first bumps with part of the second conductive wire; and the remaining parts of the second conductive wires on the electrodes may be simultaneously pressed to form the second bumps at a time in the fourth step.

According to this method, since a plurality of second bumps can be formed at the same time, the number of steps can be further reduced.

BEST MODE FOR CARRYING OUT THE INVENTION

Embodiments of the present invention are described below with reference to the drawings. As the package type of a semiconductor device according to the present invention, any of BGA (Ball Grid Array), CSP (Chip Size/Scale Package), and the like may be applied. The present invention may be applied to face-down type semiconductor devices and a module structure thereof. As examples of the face-down type semiconductor devices, a COF (Chip On Flex/Film) structure, COB (Chip On Board) structure, and the like can be given. These semiconductor devices not only include semiconductor chips mounted therein, but also may have a module structure in which passive devices such as an SMD (Surface Mount Device) such as a resistance and a capacitor are appropriately included in combination, as described later.

First Embodiment

FIGS. 1A to 4B are views showing a method of fabricating a semiconductor device according to a first embodiment to which the present invention is applied. FIGS. 1A to 4B show an example of a method of forming bumps on the semiconductor chip. In the present embodiment, bumps are formed on the semiconductor chip as an example of conductive members. Specifically, a plurality of bumps (first and second bumps 70 and 80) is formed on a semiconductor chip 10.

Figure 1A:
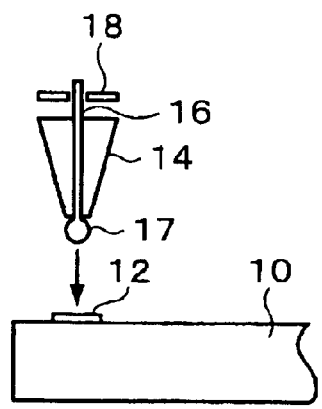
FIGS. 1A to 1C illustrate a method of fabricating a semiconductor device according to a first embodiment of the present invention.

FIGS. 1A to 2B are views showing a method of forming the first bumps 70. The semiconductor chip 10 with at least one electrode (or pad) 12 formed thereon is prepared, as shown in FIG. 1A. Each electrode 12 is generally thin and flat, formed on the first semiconductor chip 10 using aluminum, for example. There are no specific limitations to the shape of the side surface or vertical cross section of the electrodes 12. The electrodes 12 may be formed at the same height as the semiconductor chip 10. The planar shape of the electrodes 12 is not particularly limited. The electrodes 12 may be either circular or rectangular. A passivation film (not shown) is formed on the semiconductor chip 10 so as to avoid the electrodes 12. The passivation film may be formed using $SiO_2$, SiN, polyimide resin, or the like.

A capillary 14 is disposed on the side of a surface of the semiconductor chip 10 on which the electrodes 12 are formed. A conductive wire 16 such as a wire is inserted into the capillary 14. The conductive wire 16 is generally formed using gold, gold-tin, solder, copper, aluminum, or the like, although the material is not limited insofar as the material exhibits conductivity. A ball 17 is formed on the conductive wire 16 outside the capillary 14. The ball 17 is formed by discharging electricity at a high voltage to the end of the conductive wire 16 using an electric flame off, for example.

In the present invention, the conductive wire 16 for forming the first bumps may be called a first conductive wire and the conductive wire 16 for forming the second bumps may be called a second conductive wire.

Figure 1B:
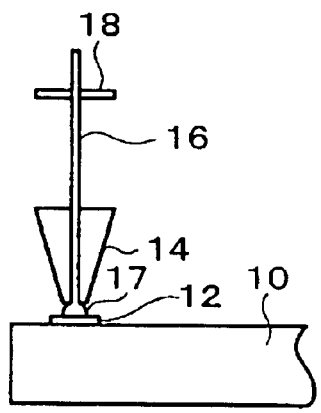

The capillary 14 is disposed above one of the electrodes 12, thereby disposing the ball 17 above this electrode 12. The capillary 14 is lowered by opening a clamper 18, whereby the ball 12 is pressed against the electrode 12. Ultrasonic waves, heat, and the like are applied while bonding the ball 17 to the electrode 12 by pressing the ball 17 at a uniform pressure. The conductive wire 16 is thus bonded to the electrode 12 as shown in FIG. 1B.

Figure 1C:
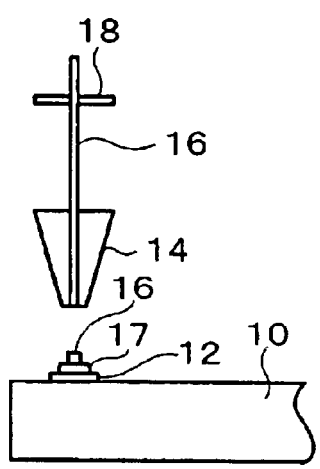

The conductive wire 16 is held by closing the damper 18. The capillary 14 and the damper 18 are simultaneously lifted as shown in FIG. 1C. The conductive wire 16 is torn off, whereby the portion including the ball 17 remains on the electrode 12. In the case where the bumps must be formed on a plurality of electrodes 12, these steps may be repeated for each electrode 12.

Part of the conductive wire 16 remaining on the electrode 12 (including the ball 17) is often has a projected shape due to looping by tearing off the conductive wire 16 on the bonded ball 17.

Figure 2A:
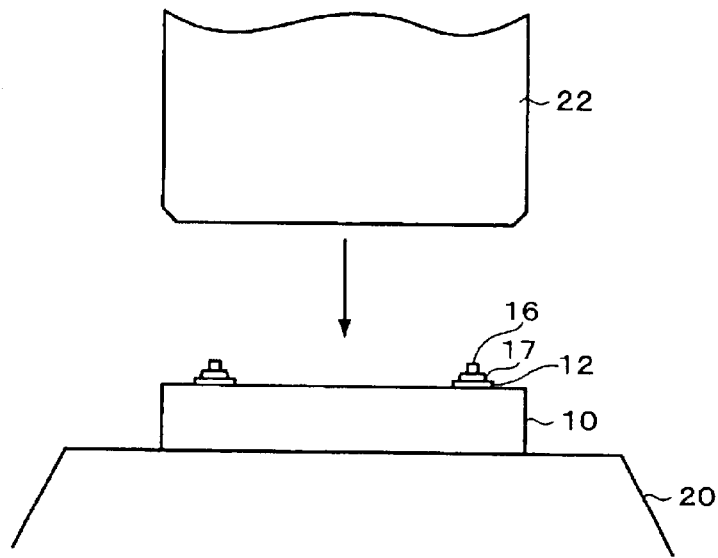
FIGS. 2A and 2B illustrate the method of fabricating a semiconductor device according to the first embodiment of the present invention.
Figure 2B:
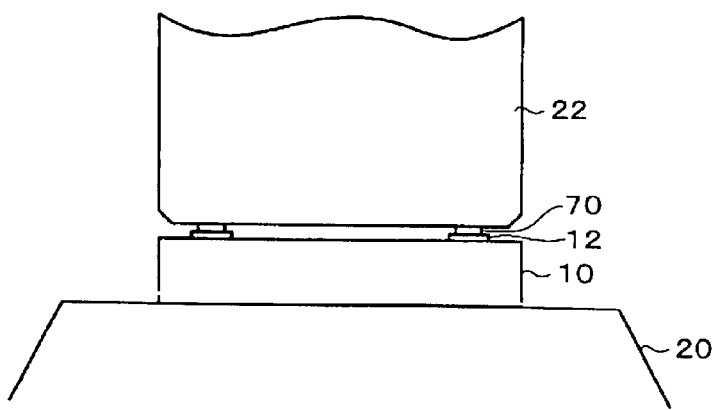
Figure 3A:
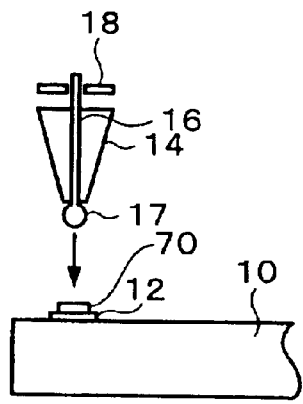
FIGS. 3A to 3C illustrate the method of fabricating a semiconductor device according to the first embodiment of the present invention.
Figure 3B:
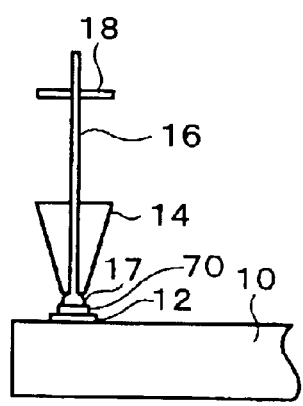
Figure 3C:
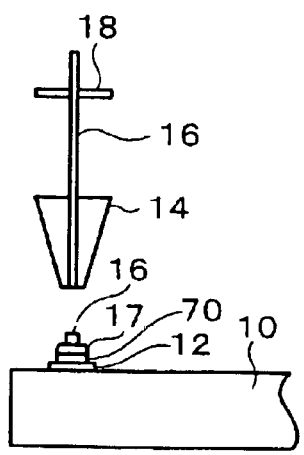

The steps shown in FIGS. 2A and 2B are then carried out. The semiconductor chip 10 on which part of the conductive wire 16 bonded to the electrode 12 (including the ball 17) remains is placed on a stand 20, as shown in. FIG. 2A. Part of the conductive wire 16 is crushed using a press jig 22, as shown in FIG. 2B. In the present embodiment, part of the conductive wires 16 remaining on a plurality of electrodes 12 is crushed at the same time. Note that part of the conductive wire 16 (including the ball 17) may be crushed for each electrode 12 (flattening step). In this step, a bonder for gang bonding or a bonder for single point bonding may be used.

The first bump 70 is thus formed on each electrode 12 as shown in FIG. 2B. It is preferable that the upper end of the first bump 70 be flat by being crushed by the press jig 22. Specifically, the first bump 70 is formed so as to be provided with stability to such an extent that the second bump 80 can be formed on the first bump 70 as described later. A depression section may be formed on the side surface of the first bump 70. The first bump 70 can be prevented from falling off by allowing the depression section to be filled with a resin (see FIG. 5) (mechanical anchoring effect). This is also applicable to the second bump 80. In the case of bumps formed on top (third bumps in FIG. 5), the flattening step ensures that the upper end of the bumps becomes flat to such an extent that these bumps are securely connected to the interconnecting pattern 32. The flattening step is a measure for enabling the second bumps 80 to be easily formed as described below. In the case where the second bumps 80 can be formed without any problem, the flattening step may be omitted or replaced by a wet back process using heat for melting.

Figure 4A:
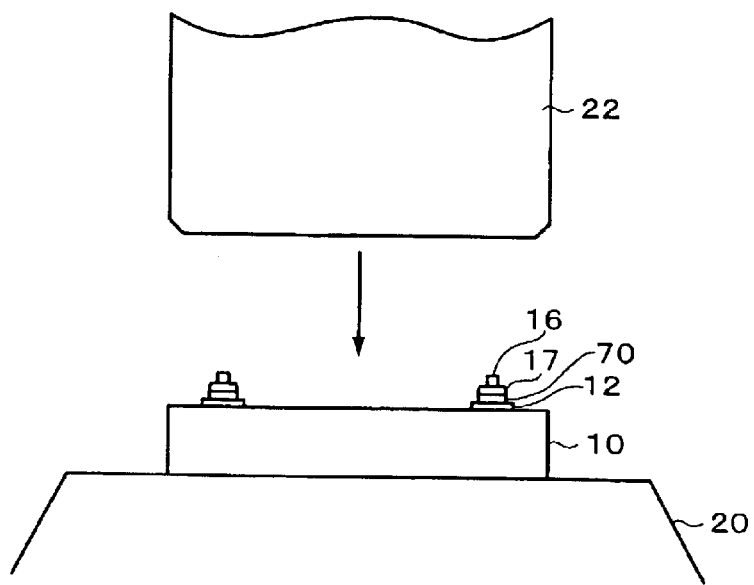
FIGS. 4A and 4B illustrate the method of fabricating a semiconductor device according to the first embodiment of the present invention.
Figure 4B:
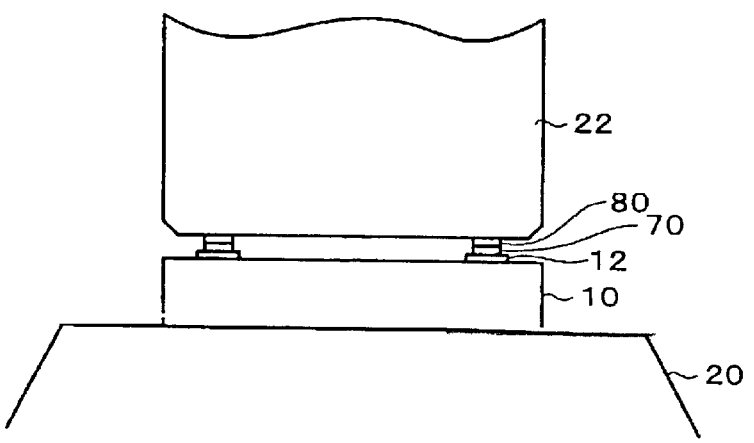

FIGS. 3A to 4B are views showing a method of forming the second bumps 80. The method of forming the second bumps 80 is the same as the method illustrated in FIGS. 1A to 2B except that the first bumps 70 are formed on the electrodes 12. In FIG. 4B, the second bump 80 is preferably layered on the first bump 70 perpendicularly thereto. It is preferable to reduce unevenness of the bump height by performing the flattening step after forming the second bumps 80. This decreases the failure rate in the step of mounting the semiconductor chip described later.

Figure 5:
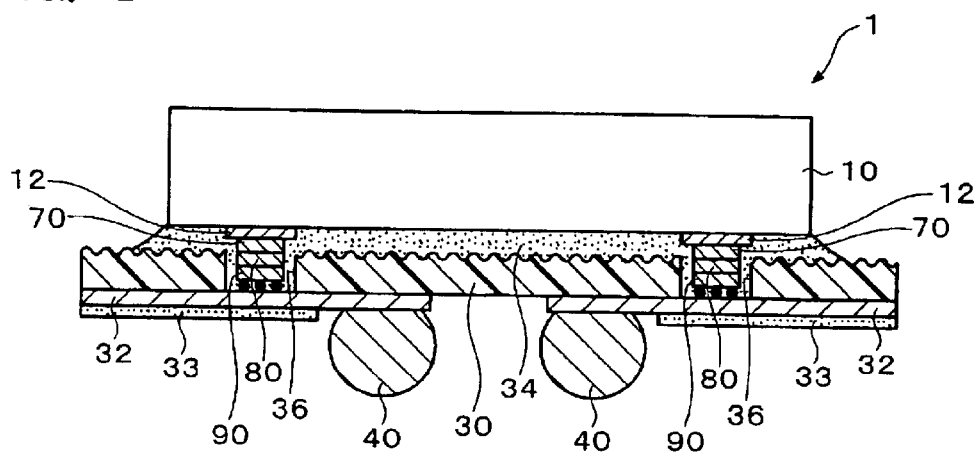
FIG. 5 shows a semiconductor device according to the first embodiment of the present invention.

Note that the first and second bumps 70 and 80 refer to two arbitrary bumps. The present invention is not limited to only two bumps but is applicable to two or more bumps. The semiconductor device according to the present invention has conductive members between the electrodes 12 and the interconnecting pattern 32. The conductive members are not limited to bumps. FIG. 5 illustrates the case of using bumps as the conductive members. The first to third bumps 70, 80, and 90 are an arbitrary number of bumps. The number of bumps is not limited. Only one bump may be used as the conductive member. Bumps other than the first bumps 70 such as the second bumps 80 may be formed using a material differing from that for the first bumps 70 according to the method of mounting the semiconductor chip as described later. In the case of forming the first bumps 70 using gold and forming the second bumps 80 using a metal having a melting point lower than gold such as gold-tin or solder, for example, the flattening step after forming the second bumps 80 can be performed using a wet back process by heating for melting or the like, whereby the fabrication steps can be simplified. Note that the semiconductor chips can be mounted using the bumps as a brazing material. Since the existing wire bonders can be utilized in the above ball bump method, the semiconductor device can be fabricated with reduced equipment investment.

The above step illustrate an example of ball bumps using bonding wire. As a method of forming the bumps, a conventional electroplating technique, electroless plating technique, paste printing technique, ball placement technique, a combination of these techniques may be used. In the case where two or more bumps are layered, the manufacturing method therefor and a combination of the materials are not limited.

Figure 6:
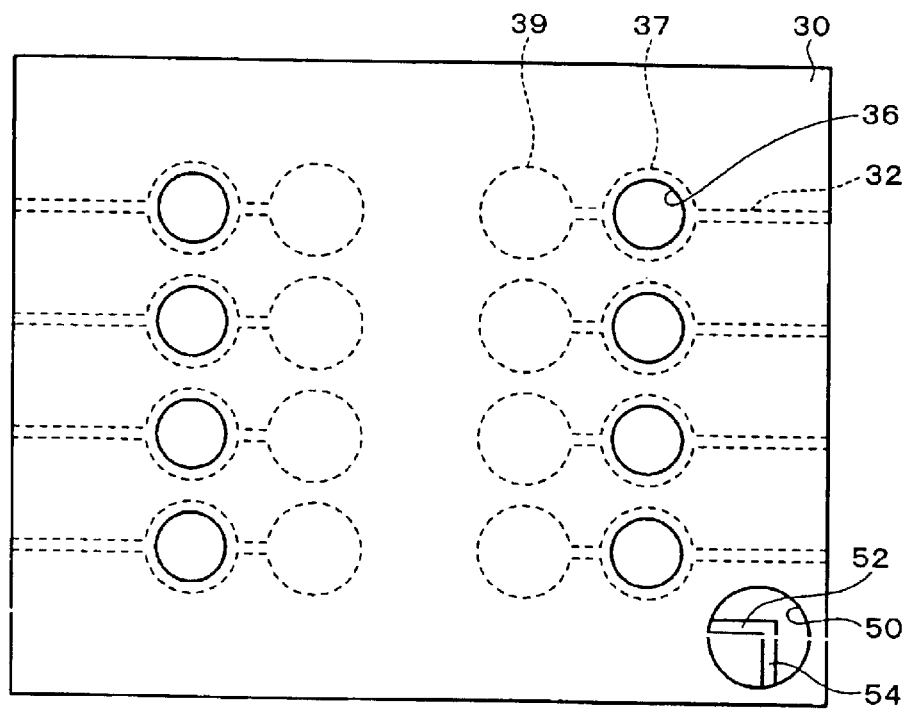
FIG. 6 shows a substrate according to the first embodiment of the present invention.

FIG. 5 is a view showing a semiconductor device according to the present embodiment. FIG. 6 is a plan view showing a substrate 30 according to the present embodiment before the semiconductor chip 10 is mounted. A semiconductor device 1 includes the semiconductor chip 10 and the substrate 30.

The semiconductor device includes the first and second bumps 70 and 80 formed by the above steps. In the present embodiment, the semiconductor device further includes the third bumps 90. In the present invention, other conductive members may be used in place of bumps.

The substrate 30 may be formed using any organic or inorganic material or a composite structure of these materials. The substrate 30 may be used as an individual piece or used in the shape of a strip in which a plurality of mounting regions of the semiconductor chip 10 is formed in a matrix. In the case of using the substrate 30 in the shape of a strip, the substrate is stamped out in another step. As examples of the substrate formed using an organic material, two-layer and three-layer flexible substrates formed of a polyimide resin and the like can be given. A tape used in TAB technology may be used as the flexible substrate. As examples of the substrate 30 formed using an inorganic material, a ceramic substrate, a glass substrate, and the like can be given. As examples of a substrate formed of a composite structure of organic and inorganic materials, a glass epoxy substrate and the like can be given. There are no specific limitations to the planar shape of the substrate 30. It is preferable that the substrate 30 be similar in shape to the semiconductor chip 10.

The interconnecting pattern 32 is formed on the substrate 30. In the present embodiment, the interconnecting pattern 32 is formed on one surface of the substrate 30. The interconnecting pattern 32 is formed by a plurality of interconnecting lines. Specifically, the interconnecting pattern 32 is formed on the substrate 30 by routing a plurality of interconnecting lines into a specific shape. The interconnecting pattern 32 is generally formed by etching copper foil. The interconnecting pattern 32 may be formed of two or more layers. Copper foil is generally bonded to the substrate 30 in advance through an adhesive (not shown). As another example, the interconnecting pattern 32 may be formed by layering any of copper (Cu), chromium (Cr), titanium (Ti), nickel (Ni), and titanium tungsten (Ti—W). For example, the interconnecting pattern 32 may be formed by etching after applying photolithography. The interconnecting pattern 32 may be directly formed on the substrate 30 by sputtering. In addition, the interconnecting pattern 72 may be formed by plating. Part of the interconnecting pattern 32 may be formed into land sections 37 and 39 having an area larger than the sections which become the lines. The land sections 37 and 39 have a function of sufficiently securing the electrical connections. Therefore, as shown in FIG. 6, the land sections 37 may be formed in the connection sections with the electrodes 12, and the land sections 39 may be formed in the connection sections with the external terminals 40 as described later.

A plurality of holes 36 is formed in the substrate 30. The conductive members (first to third bumps 70, 80, and 90) formed on the electrodes 12 of the semiconductor chip 10 are inserted into the holes 36. In this case, the conductive members have a height so as to electrically connect the electrodes 12 of the semiconductor chip 10 to the interconnecting pattern 32 (land sections 37). For example, one bump (first bump 70, for example) may be formed to have a height so as to electrically connect the electrodes 12 to the interconnecting pattern 32. In the case of forming a plurality of bumps, each bump may be formed so that the total height of the layered bumps exceeds the distance between the electrodes 12 and the interconnecting pattern 32.

The holes 36 are formed in the substrate 10 inside the mounting region of the semiconductor chip 10 corresponding to the arrangement and the number of the electrodes 12. For example, the holes 36 may be formed along two sides of the substrate 10 facing each other inside the mounting region of the semiconductor chip 10 corresponding to the electrodes 12 formed along two sides of the semiconductor chip 10 facing each other, as shown in FIG. 6. One conductive member may be disposed in one hole 36. The holes 36 have a cross-sectional area which allows insertion of the conductive members. The shape of the holes 36 may be either circular or rectangular. The holes 36 are formed through the substrate 30. The interconnecting pattern 32 formed on one surface of the substrate 30 close one of the openings of the holes 36. Specifically, the land sections 37 close the opening of the holes 36 on the side of the surface on which the interconnecting pattern 32 is formed. It is preferable that the conductive members be formed to have a height greater than the thickness of the substrate 30 so as to be electrically connected to the interconnecting pattern 32 (land sections 37).

The semiconductor chip 10 is mounted on a surface of the substrate 30 on which the interconnecting pattern 32 is not necessarily required, such that a surface of the semiconductor chip on which the electrodes 12 are formed faces the substrate 30. In the present embodiment, the interconnecting pattern. 32 is not formed on the surface of the substrate 30 on which the semiconductor chip 10 is mounted. The conductive members formed on the electrodes 12 are inserted into the holes 36 and electrically connected to the interconnecting pattern 32 (land sections 37) formed on one of the openings of the holes 36. Specifically, the conductive members are electrically connected to the interconnecting pattern 32 (land sections 37) exposed by the holes 36. The semiconductor device according to the present invention has conductive members between the electrodes 12 and the interconnecting pattern 32. The conductive members are not limited to bumps. As examples of other conductive members, conductive paste, conductive balls, and the like can be given. The conductive members may be formed on the interconnecting pattern 32 (land sections 37) exposed by the holes 36. Both of these conductive members and the conductive members formed on the semiconductor chip 10 may be used as the conductive members.

According to this semiconductor device, the conductive members formed on the electrodes 12 of the first semiconductor chip 10 are disposed in the holes 36 and connected to the interconnecting pattern 32. This allows the interconnecting pattern 32 to be located on a surface of the substrate 30 opposite to the mounting region of the semiconductor chip 10. Specifically, since the interconnecting pattern 32 is not covered with the semiconductor chip 10, the interconnecting pattern 32 can be designed without limitation. The interconnecting pattern 32 is formed opposite the semiconductor chip 10 through the substrate 30. Therefore, signals in an integrated circuit in the semiconductor chip 10 scarcely interfere with signals in the interconnecting pattern 32, whereby cross talk can be reduced. Because of this, a semiconductor device with an increased degree of freedom in designing the interconnecting pattern 32 can be obtained without decreasing connection reliability.

A resin is provided between the semiconductor chip 10 and the substrate 30. Specifically, in the present embodiment, a resin is provided to the surface of the substrate 30 on which the interconnecting pattern 32 is not formed and within at least the mounting region (including holes 36) of the semiconductor chip 10. In the present embodiment, the resin is an anisotropic conductive material 34. The anisotropic conductive material 34 is prepared by dispersing conductive particles (fillers) in an adhesive (binder). A dispersing agent may be added to the anisotropic conductive material 34. A heat-curable adhesive is generally used as the adhesive for the anisotropic conductive material 34. As the anisotropic conductive material 34, an anisotropic conductive film previously formed into a sheet is generally used. In addition, a liquid anisotropic conductive material may be used. The anisotropic conductive material 34 is pressed between the conductive members and the interconnecting pattern 32, thereby establishing electrical connection between them through the conductive particles. The present invention is not limited to this configuration. As the method for establishing electrical connection between the conductive members and the interconnecting pattern 32, a method using a metal junction such as Au—Au, Au—Sn, or solder, a method using conductive resin paste, a method utilizing the shrinkage force of an insulating resin, and the like can be given. Any of these methods may be used.

In the case of employing any mounting method, an insulating resin is generally sealed at least between the substrate 30 and the semiconductor chip 10. According to this semiconductor device, the semiconductor chip 10 is mounted on a surface of the substrate 30 on which the interconnecting pattern 32 is not necessarily required, and the resin is provided between the substrate 30 and the semiconductor chip 10. Therefore, even if the interconnecting pattern 32 is not formed on a surface of the substrate 30 on which the semiconductor chip 10 is mounted, delamination can be prevented since the resin is provided on the substrate 30 exhibiting comparatively excellent adhesion. The substrate 50 is interposed between the semiconductor chip 10 and the interconnecting pattern 32. Therefore, in the case of forming the substrate 30 using a soft material, the substrate 30 can absorb stress applied to the semiconductor chip 10 and the interconnecting pattern 32. Because of this, a semiconductor device with an increased degree of freedom in designing the interconnecting pattern 32 can be obtained more effectively without decreasing connection reliability.

At least the region of the substrate 30 in which the anisotropic conductive material 34 is provided may be roughed. Specifically, the surface of the substrate 30 may be roughed so as to impair flatness. The surface of the substrate 30 may be roughed mechanically by sandblasting, physically using plasma, ultraviolet rays, or ozone, or chemically using an etching material. This enables the substrate 30 to be bonded to the anisotropic conductive material 34 more securely by increasing the bonding area between the substrate 30 and the anisotropic conductive material 34 or increasing the physical and chemical adhesive force.

A recognition hole 50 and recognition patterns 52 and 54 formed on the recognition hole 50 may be provided to the substrate 30, as shown in FIG. 6. The conductive members can be easily and securely inserted into the holes 36 by using the recognition hole 50 and the recognition patterns 52 and 54. Therefore, it is preferable that the recognition hole 50 and the recognition patterns 52 and 54 be formed in a region of the substrate 30 other than the mounting region of the semiconductor chip 10. The shape and size of the recognition hole 50 are not limited insofar as the recognition patterns 52 and 54 can be recognized. The recognition patterns 52 and 54 may be formed across the recognition hole 50 as shown in FIG. 6. The shape of the recognition patterns 52 and 54 is not limited thereto. The recognition patterns 52 and 54 are formed within the recognition hole 50 on a surface of the substrate 30 on which the interconnecting pattern 32 is formed. In the case where the substrate 30 exhibits light transmissibility, the recognition hole 50 is not necessarily formed. In this case, the recognition patterns 52 and 54 are recognized through the substrate 30.

For example, the recognition patterns 52 and 54 may be formed by the first pattern 52 extending in the X-axis direction of the two-dimensional coordinates established on the surface of the substrate 30 and the second pattern 54 extending in the Y-axis direction. The recognition patterns 52 and 54 preferably have a structure so that the position of the semiconductor chip 10 can be recognized two-dimensionally on the surface of the substrate. Part or all of the land sections 39, external terminals 40, and interconnecting pattern 32 may be used as the recognition patterns 52 and 54. The holes 36 or marks formed by printing, laser processing, or the like may be used as the recognition patterns 52 and 54.

A plurality of external terminals 40 may be formed on a surface of the interconnecting pattern 32 opposite to the surface facing the substrate 30. The external terminals 40 may be formed in the land sections 39 of the interconnecting pattern 32. A protective film 33 may be formed on the surface of the interconnect patter 32 on which the external terminals 40 are formed except the area of the external terminals 40. It is preferable that the protective film 33 be an insulating member such as solder resist. In particular, the protective film 33 covers and protects the surface of the interconnecting pattern 32.

The external terminals 40 may be formed using solder, a metal other than solder, a conductive resin, or the like. FIG. 5 shows a FAN-IN semiconductor device in which the external terminals 40 are formed only in the mounting region of the semiconductor chip 10. However, the present invention is not limited thereto. For example, the present invention may be applied to a FAN-OUT semiconductor device in which the external terminals 40 are formed only outside the mounting region of the semiconductor chip 10, or to a FAN-IN/OUT semiconductor device including the FAN-OUT semiconductor device and FAN-IN semiconductor device in combination.

The method of fabricating the semiconductor device after the step of forming the bumps on the semiconductor chip 10 is described below.

The semiconductor chip 10 is mounted on the substrate 30. Specifically, a surface of the semiconductor chip 10 on which the electrodes 12 are formed faces a surface of the substrate opposite to the surface on which the interconnecting pattern 32 is required to be formed. Part of the surface of the substrate 30 may be roughed by sandblasting or plasma.

In the case where the resin is the anisotropic conductive material 34, the anisotropic conductive material 34 is previously provided to the substrate 30 before mounting the semiconductor chip 10. Specifically, the anisotropic conductive material 34 is provided to the substrate 30, thereby allowing the conductive members to be electrically connected to the interconnecting pattern 32. According to the present embodiment, the electrodes 12 are electrically connected to the interconnecting pattern 32 through the anisotropic conductive material 34, and, at the same time, the semiconductor chip 10 and the substrate 30 can be underfilled. Therefore, the semiconductor device can be fabricated using a method excelling in reliability and productivity. In the case where the anisotropic conductive material 34 is heat-curable, the substrate 30 and the semiconductor chip 10 can be bonded by curing the anisotropic conductive material 34 using heat after mounting the semiconductor chip 10.

In the case where the recognition hole 50 and the recognition patterns 52 and 54 are formed on the substrate 30, the semiconductor chip 10 can be positioned on the substrate 30 by recognizing the recognition hole 50 and the recognition patterns 52 and 54. For example, the recognition patterns 52 and 54 are formed by the first pattern 52 extending in the X-axis direction of the two-dimensional coordinates established on the surface of the substrate 30 and the second pattern 54 extending in the Y-axis direction, as shown in FIG. 6. In this case, the semiconductor chip 10 can be positioned on the substrate 30 by finding the Y coordinates on the surface of the substrate by recognizing the recognition pattern 52 and finding the X coordinates by recognizing the recognition pattern 54. This enables the semiconductor chip 10 to be accurately mounted at a specific position on the substrate 30.

The step of providing the resin may be performed after mounting the semiconductor chip 10 excluding the case where the anisotropic conductive material 34 is used as the resin. In this case, the semiconductor, chip 10 and the substrate 30 may be underfilled by filling the space between the semiconductor chip 10 and the substrate 30 with the resin while removing bubbles, for example.

A plurality of external terminals 40 may be formed on the interconnecting pattern 32. Specifically, the external terminals 40 are formed on surface of the interconnecting pattern 32 opposite to the surface facing the substrate. For example, the external terminals 40 are formed in the land sections 39, as shown in FIG. 6. The external terminals 40 may be formed using a conductive material such as solder or a metal. In the present embodiment, the external terminals 40 are solder balls. The solder balls are formed by a reflow process consisting of providing solder balls and flux, cream solder, or the like and melting the solder by heating. Therefore, the above heating step for the anisotropic conductive material 34 (in the case of heat-curable material) may be omitted, and formation of the solder balls and heating for the anisotropic conductive material 74 may be performed at the same time in this reflow process. In addition, other passive devices to be mounted on the substrate 30 may be soldered at the same time.

Second Embodiment

Figure 7:
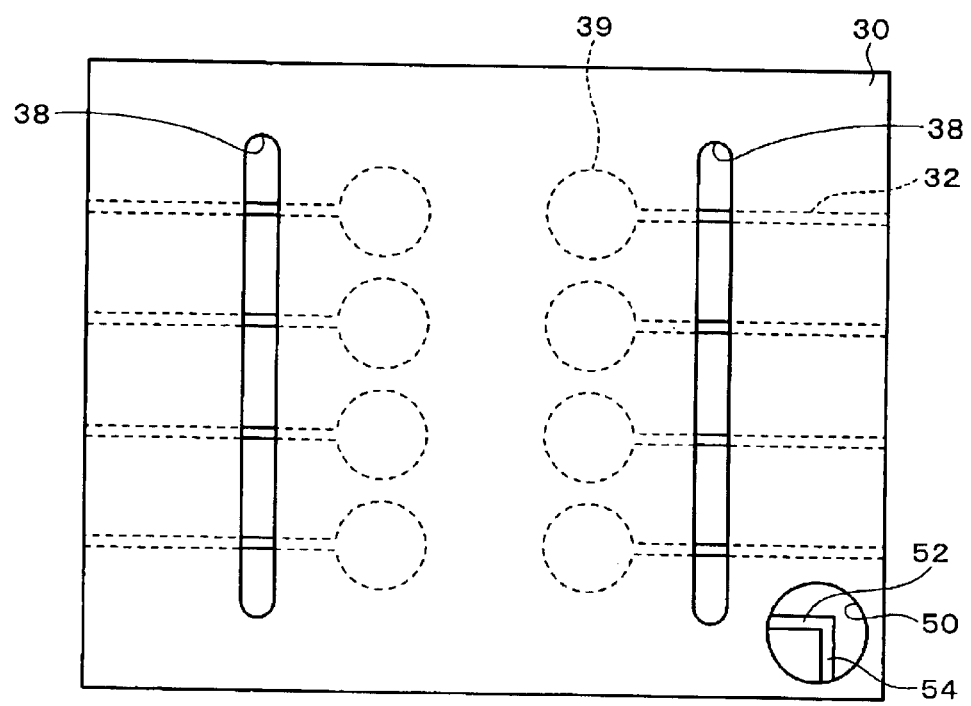
FIG. 7 shows a substrate according to a second embodiment of the present invention.

FIG. 7 is a plan view showing the substrate 30 according to the present embodiment before the semiconductor chip 10 is mounted. The present embodiment differs from the first embodiment as to the configuration of the holes. In the present embodiment, the holes are slits 38. Long, narrow slits 38 are formed. Part of the interconnecting pattern 32 is formed across the slits 38 in the direction of the width of the slits 38. Specifically, two or more interconnecting lines among a plurality of interconnecting lines are formed across the slits 38.

The slits 38 are formed corresponding to the rows of each electrode 12 of the semiconductor chip 10. For example, two slits 38 may be formed in the substrate 10 along two sides of the mounting region of the semiconductor chip 10 facing each other corresponding to the electrodes 12 formed along two sides of the semiconductor chip 10 facing each other, as shown in FIG. 7. A plurality of electrodes 12 may be disposed on one slit 38. Specifically, two or more conductive members formed on the electrodes 12 may be inserted into one slit. The size and shape of the slits 38 maybe optionally determined according to the arrangement of the electrodes 12. This enables necessary holes to be easily formed in the substrate 30 in comparison with the case of forming holes corresponding to each electrode 12. The slits 38 may be divided as required. Other structures are the same as those in the first embodiment.

A method of fabricating the semiconductor device according to the present embodiment is described below. In the present embodiment, the same steps as in the first embodiment can be performed except for the steps relating to the slits 38 formed in the substrate 30.

Step of Providing Resin

In this step, a resin is provided to the substrate 30. The resin is provided to the substrate 30 at least in the mounting region of the semiconductor chip 10. The resin (anisotropic conductive material 34, for example) may be provided before mounting the semiconductor chip 10 on the substrate 30. The resin may be provided after mounting the semiconductor chip 10.

In the present embodiment, the slits 38 are formed in the substrate 30. Part of the slits 38 is an opening. Therefore, a member is provided as an underlay to the side of the substrate 30 on which the interconnecting pattern 32 is formed before providing a resin to the substrate 30. In other words, the opening of the slits 38 is closed by placing the substrate 30 on the member. The member preferably exhibits no affinity (or low affinity) to the resin to such an extent that the resin is not allowed to permeate into the member at least in the region of the substrate 30 in which the slits 38 are disposed. Specifically, the member preferably has properties for repelling the resin. This enables the resin to be provided on the substrate 30 without allowing the resin to leak out or to penetrate into the member. This is particularly effective when preparing the resin as liquid or gel.

Figure 8:
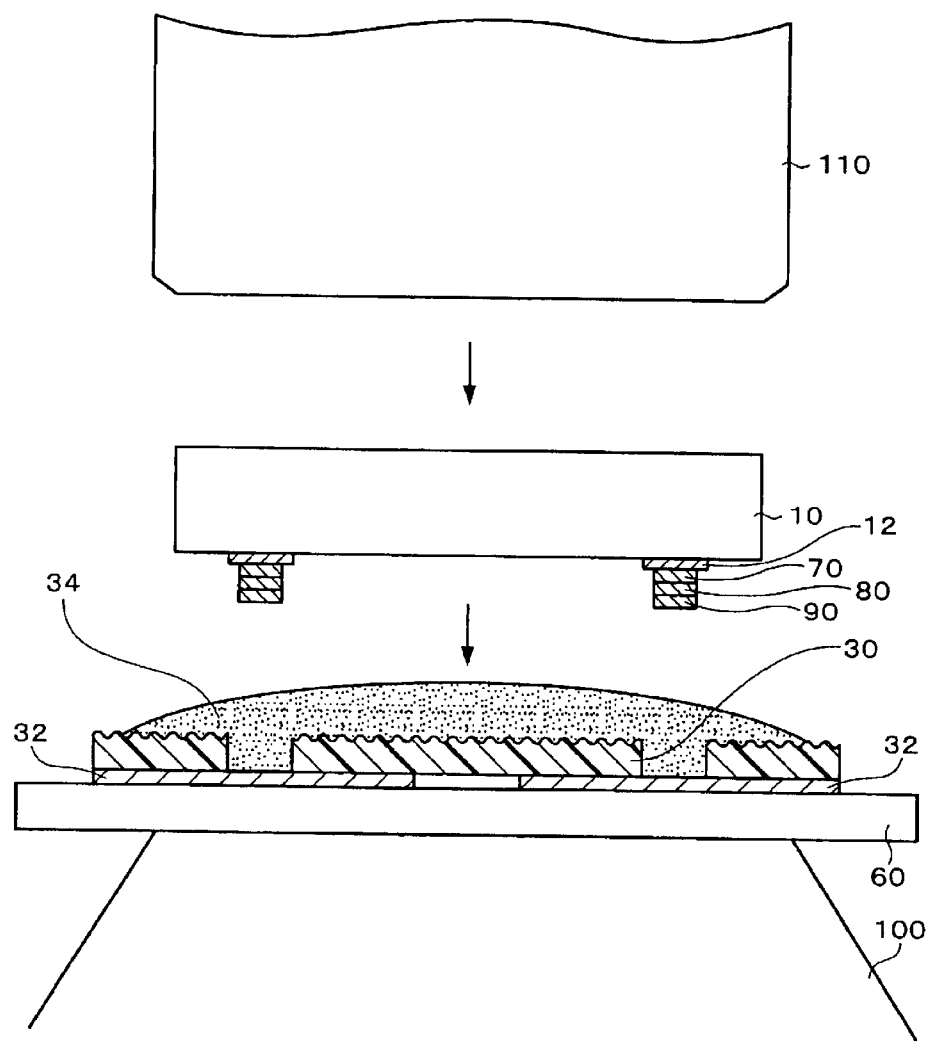
FIGS. 8 illustrate a method of fabricating a semiconductor device according to the second embodiment of the present invention.

For example, a Teflon sheet 60 may be prepared on a stand 100, and the substrate 30 may be placed on the Teflon sheet 60, as shown in FIG. 8. The anisotropic conductive material 34 is then provided to the substrate 30, and the semiconductor chip 10 is placed on the substrate 30. The semiconductor chip 10 is pressed against the substrate 30 using a press jig 110. In the case of filling the space between the semiconductor chip 10 and the substrate 30 with the resin, the substrate 30 provided with the semiconductor chip 10 may be placed on the stand 100 through the Teflon sheet 60.

In the present embodiment, the interconnecting pattern 32 is located on a surface of the substrate 30 opposite to the mounting region of the semiconductor chip 10. Specifically, since the interconnecting pattern 32 is not covered with the semiconductor chip 10, the interconnecting pattern 32 can be designed without limitation. The interconnecting pattern 32 is formed opposite the semiconductor chip 10 through the substrate 30. Therefore, signals in the integrated circuit in the semiconductor chip 10 scarcely interfere with signals in the interconnecting pattern 32, whereby cross talk can be reduced. Because of this, a semiconductor device with an increased degree of freedom in designing the interconnecting pattern 32 can be obtained without decreasing connection reliability.

Third Embodiment

FIGS. 9A to 9D are views showing a method of fabricating a semiconductor device according to the present embodiment. In the present embodiment, a semiconductor device shown in FIG. 9D includes the semiconductor chip 10, substrate 30, and external terminals 40.

The substrate 30 is the same as described above. The substrate 30 may be any of a substrate formed using an organic material such as a flexible substrate, a substrate formed using an inorganic material such as a metal substrate, and a combination of these. Through-holes 31 are formed in the substrate 30. The interconnecting pattern 32 is formed to extend over the through-holes 31. Land sections for forming the external terminals (not shown) may be formed on the through-holes 31 as part of the interconnecting pattern 32.

After preparing the substrate 30 in this manner, the anisotropic conductive material 34 is provided to the substrate 30. The anisotropic conductive material 34 may be provided in the area greater than the area of the electrodes 12 in the semiconductor chip 10.

The semiconductor chip 10 is placed on the anisotropic conductive material 34. Specifically, the semiconductor chip 10 is placed on the anisotropic conductive material 34 with the surface on which the electrodes 12 are formed facing the anisotropic conductive material 34. In the present embodiment, the first and second bumps 70 and 80 are formed on the electrode 12. The method for forming these bumps is the same as described above. The second bumps 80 may be formed using a material differing from that for the first bumps 70. For example, the first bumps 70 may be formed using gold, and the second bumps 80 maybe formed using gold-tin or a metal having a melting point lower than gold such as solder. Advantage thereof is the same as described above. The semiconductor chip 10 is disposed so that the electrodes 12 are located on the land sections for connecting terminals (not shown) of the interconnecting pattern 32. The first and second bumps 70 and 80 may be formed on the side of the interconnecting pattern 32.

As a result of these steps, the anisotropic conductive material 34 is interposed between the surface of the semiconductor chip 10 on which the electrodes 12 are formed and the surface of the substrate 30 on which the interconnecting pattern 32 is formed. The semiconductor chip 10 is pressed against the substrate 30 by pressing the surface of the semiconductor chip 10 opposite to the surface on which the electrodes 12 are formed using the jig 110. The jig 110 may have a heating means such as a heater. The semiconductor chips 10 may be heated using the heating means. It is preferable to use a jig having a planar area greater than that of the semiconductor chip 10 as the jig 110 in order to also apply heat to the anisotropic conductive material 34 located outside the semiconductor chip 10. This enables heat to be easily applied to the periphery of the semiconductor chip 10.

Since the semiconductor chip 10 is heated by the jig 110, the adhesive in the anisotropic conductive material 34 is cured in the region in contact with the semiconductor chip 10. Note that the adhesive in the anisotropic conductive material 34 is not completely cured in the region not in contact with the semiconductor chip 10 or in the region apart from the semiconductor chip 10 since heat does not reach. The adhesive in these regions are cured in the next step.

In the case of forming the external terminals 40 using solder, for example, solder 42 is provided in the through-holes 31 in the substrate 30 and the vicinity thereof. The solder 42 may be provided by a printing method using cream solder, for example. Solder balls formed in advance may be placed on the above position.

Figure 9A:
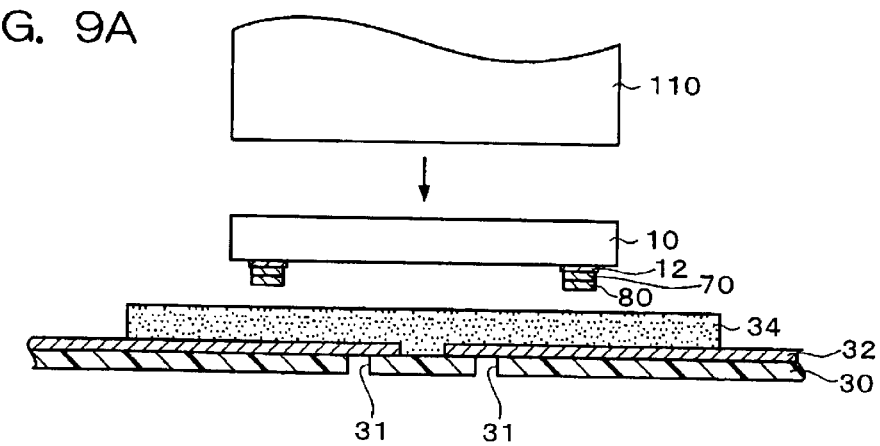
FIGS. 9A to 9D illustrate a method of fabricating a semiconductor device according to a third embodiment of the present invention.
Figure 9B:
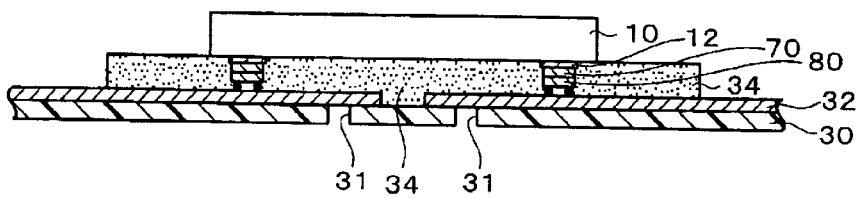
Figure 9C:
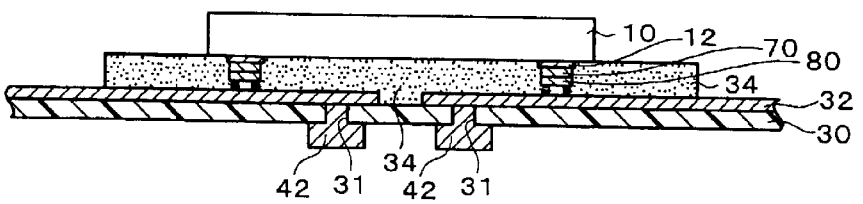
Figure 9D:
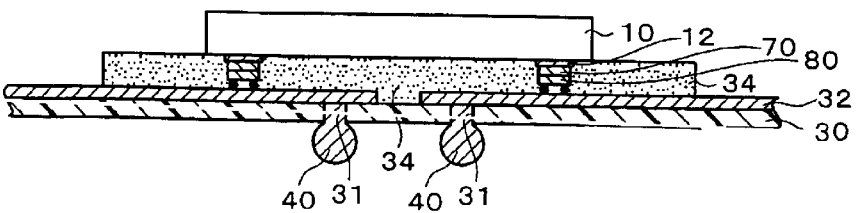

The solder 34 is heated in a reflow process, thereby forming the external terminals 40, as shown in FIG. 9D. In this reflow process, not only the solder 42 but also the anisotropic conductive material 34 are heated. Uncured regions of the anisotropic conductive material 34 are cured by this heating. Specifically, the anisotropic conductive material 34 is cured in the region not in contact with the semiconductor chip 10 or in the region apart from the semiconductor chip 10 in the reflow process for forming the external terminals 40.

According to the semiconductor device thus obtained, since the interval between the semiconductor chip 10 and the substrate 30 is increased by the height of the first and second bumps 70 and 80 formed on the electrodes 12 of the semiconductor chip 10, a large amount of resin can be provided right under the semiconductor chips 10. This allows the resin to fully function as a stress relaxation layer. In the present embodiment, the first and second bumps 70 and 80 refer to an arbitrary number of bumps. The present embodiment is applicable to at least two bumps. In the present invention, the electrical connections between the electrodes 12 and the interconnecting pattern 32 are not limited to the anisotropic conductive material 34, to which various configurations (described above) may be applied.

In all of the above embodiments, a semiconductor device having external terminals is described. Part of the substrate may be extended and the external connection may be established therefrom. Part of the substrate 30 may be used as leads for connectors, or connectors may be mounted on the substrate 30. In addition, the interconnecting pattern 32 of the substrate 30 may be connected to other electronic instruments.

Instead of positively forming the external terminals 40, the external terminals may be formed using solder cream applied to a motherboard when mounting the semiconductor device on the motherboard due to surface tension during melting. Such a semiconductor device is referred to as a land grid array semiconductor device. In all of the above embodiments, a plurality of semiconductor chips may be mounted, or semiconductor chips and passive devices may be mounted in combination.

FIG. 8 is a view showing a circuit board 1000 provided with the semiconductor device 1 according to the present embodiment. An organic substrate such as a glass epoxy substrate is generally used as the circuit board 1000. Interconnecting pattern is formed on the circuit board 1000 using copper, for example, so as to form a desired circuit. Electrical continuity between the interconnecting pattern and the semiconductor device 1 is established by mechanically connecting the interconnecting pattern to the external terminals 40 of the semiconductor device 1.

Figure 10:
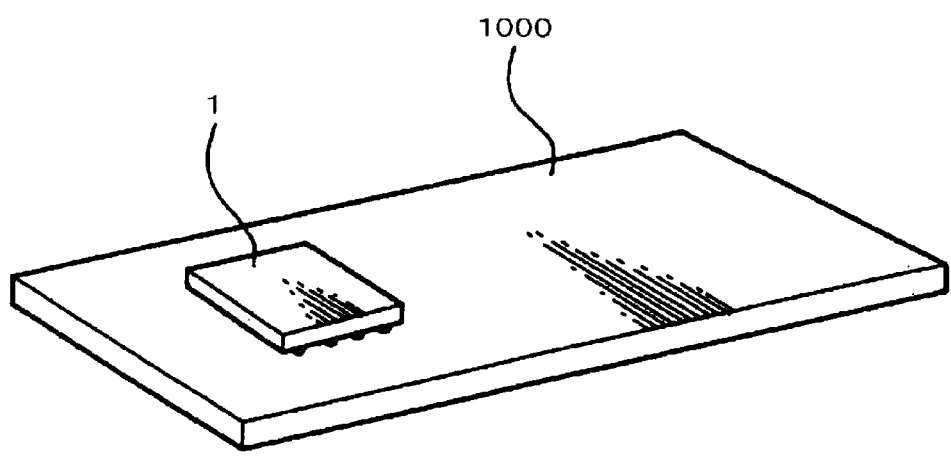
FIG. 10 shows a circuit board on which the semiconductor device according to the present invention is mounted.
Figure 11:
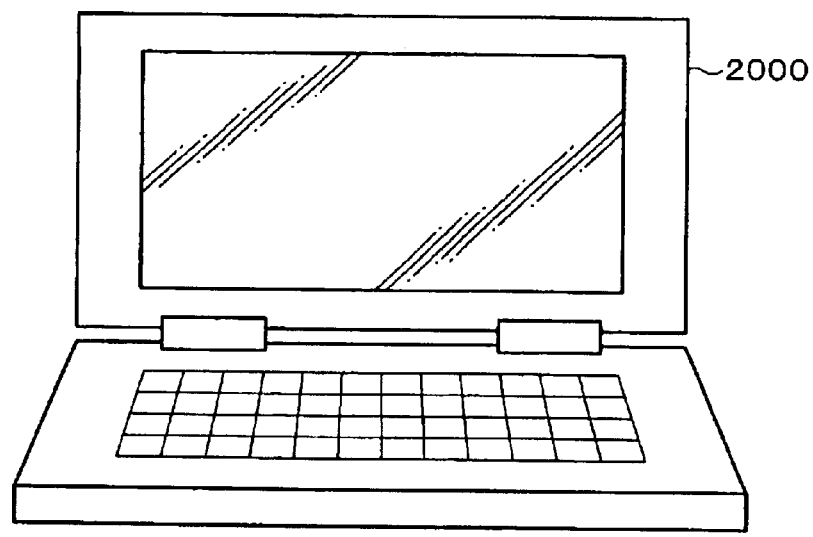
FIG. 11 shows an electronic instrument having the semiconductor device according to the present invention.
Figure 12:
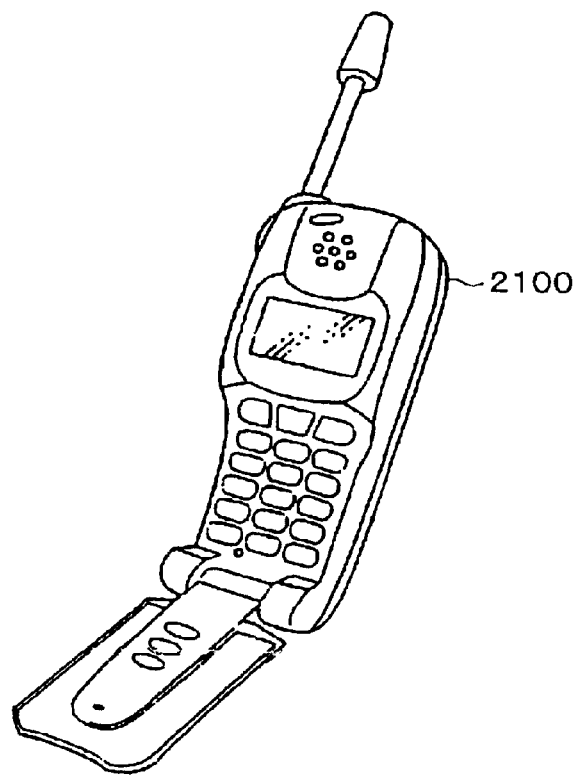
FIG. 12 shows an electronic instrument having the semiconductor device according to the present invention.

FIGS. 10 and 11 respectively show a notebook-type personal computer and a portable telephone as examples of the electronic instrument provided with the semiconductor device 1 to which the present invention is applied.

In the above embodiments, a semiconductor chip and a semiconductor device using the semiconductor chip are described. The present invention is applicable to all embodiments of an electronic chip using projections.

Note that the "semiconductor chip" that is a structural component of the present invention could be replaced by an "electronic element," and electronic elements (either active elements or passive elements) can be mounted on a substrate to fabricate an electronic component, in a manner similar to that of semiconductor chips. Examples of electronic components fabricated by using such electronic elements include optical elements, resistors, capacitors, coils, oscillators, filters, temperature sensors, thermistors, varistors, variable resistors, or fuses, by way of example.

All of the above-described embodiments may be applied to a semiconductor device (or mounted module) in which semiconductor chips and other electronic elements as described above are mounted on a substrate in combination.

What is claimed is:

1. A semiconductor device, comprising:

a substrate including a plurality of holes and a surface over which an interconnecting pattern is formed, part of the interconnecting pattern being superposed over the holes;

a semiconductor chip disposed over another surface of the substrate and including a plurality of electrodes to be positioned over the holes; and conductive members provided within the holes for electrically connecting the electrodes to the interconnecting pattern, a recognition hole formed in the substrate at a position differing from the holes, and a recognition pattern formed over the recognition hole on the side of a surface of the substrate including the interconnecting pattern.

2. The semiconductor device as defined in claim 1, the recognition hole formed in the substrate outside a mounting region for the semiconductor chip.

3. The semiconductor device as defined in claim 1, the recognition pattern includes:

a first pattern extending in the X-axis direction of the two-dimensional coordinate system established on a surface of the substrate; and a second pattern extending in the Y-axis direction.

4. A semiconductor device, comprising:

a substrate including a plurality of holes and a surface over which an interconnecting pattern is formed, part of the interconnecting pattern being superposed over the holes;

a semiconductor chip disposed over another surface of the substrate and including a plurality of electrodes to be positioned over the holes; and conductive members provided within the holes for electrically connecting the electrodes to the interconnecting pattern, the conductive members are a plurality of layered bumps, the bumps include first bumps formed on the electrodes and second bumps formed on the first bumps, and the second bumps formed of a metal which has a melting point lower than the melting point of the first bumps.

5. The semiconductor device as defined in claim 4, the first bumps formed of gold.

6. The semiconductor device as defined in claim 5, the second bumps formed of solder.

* * * * *